United States Patent
Hable

(10) Patent No.: US 7,592,696 B2
(45) Date of Patent: Sep. 22, 2009

(54) POWER MODULE HAVING AT LEAST TWO SUBSTRATES

(75) Inventor: Wolfram Hable, Neumarkt (DE)

(73) Assignee: Infineon Technologies AG, Neubiberg (DE)

( * ) Notice: Subject to any disclaimer, the term of this patent is extended or adjusted under 35 U.S.C. 154(b) by 288 days.

(21) Appl. No.: 11/636,836

(22) Filed: Dec. 11, 2006

(65) Prior Publication Data
US 2007/0099437 A1    May 3, 2007

Related U.S. Application Data

(62) Division of application No. 10/510,455, filed on Apr. 22, 2005, now Pat. No. 7,176,057.

(51) Int. Cl.
*H01L 23/34* (2006.01)
(52) U.S. Cl. ....................... 257/713; 257/723
(58) Field of Classification Search ................. 257/685, 257/687, 693, 705, 713, 723
See application file for complete search history.

(56) References Cited

U.S. PATENT DOCUMENTS

| 4,768,075 | A | 8/1988 | Broich et al. |
| 5,332,921 | A | 7/1994 | Dousen et al. |
| 5,471,089 | A | 11/1995 | Nagatomo et al. |
| 6,016,253 | A | 1/2000 | Seitz et al. |
| 6,341,066 | B1 | 1/2002 | Murowaki et al. |
| 2002/0012239 | A1 | 1/2002 | Dent |

FOREIGN PATENT DOCUMENTS

| JP | 62-134956 | * | 6/1987 |
| JP | 62134956 | | 6/1987 |
| JP | 2001085613 | | 3/2001 |
| WO | 00/07446 | | 7/2000 |

* cited by examiner

*Primary Examiner*—Thien F Tran
(74) *Attorney, Agent, or Firm*—Dicke, Billig, Czaja PLLC

(57) ABSTRACT

The invention relates to a power module 3 and a method for producing it. The power module 3 has a first substrate 1 having power semiconductor chips 4, and a second substrate 2 populated with signal semiconductor chips 5. The substrates 1 and 2 are oriented parallel one above the other, their placement sides 7 and 8 being arranged facing one another, and the second substrate 2, with the aid of bonding wires 9 bent in hingelike fashion, being held at a defined distance d from the first substrate 1 and being mechanically fixed in a plastic housing 18 and electrically connected.

22 Claims, 6 Drawing Sheets

POWER MODULE HAVING AT LEAST TWO SUBSTRATES

CROSS REFERENCE TO RELATED APPLICATIONS

This Utility patent application is a divisional of copending U.S. patent application Ser. No. 10/510,455, which claims the benefit of the filing date of German Application No. DE 102 14 953.4, filed Apr. 4, 2002, and International Application No. PCT/DE2003/001067, filed Apr. 1, 2003, each of which is herein incorporated by reference.

FIELD OF THE INVENTION

The invention relates to a power module having at least two substrates and a method for producing it.

BACKGROUND

In order to create intelligent power modules, logic circuits and passive components are increasingly being integrated besides power components in a hybrid design in a power module. With an increasing number of signal semiconductor chips on the substrate area, the demand for expensive substrate ceramic continually increases, so that the costs for intelligent power modules continually rise. These costs also cannot be reduced by stacking a plurality of substrates one above the other, especially as the supporting and connecting technology in the case of stacked structures likewise drives up the costs.

SUMMARY

Embodiments of the invention provide a power module which has both power semiconductor chips and signal semiconductor chips, is simple and inexpensive to produce and does not enlarge the area needed for a substrate with semiconductor chips despite additional signal semiconductor chips.

In one embodiment, the invention provides a power module having a first substrate populated with power semiconductor chips, and a second substrate populated with signal semiconductor chips. In this case, the substrates in the power module are oriented parallel one above the other and their placement sides are arranged facing one another. The two placement sides are electrically connected to one another via bonding wires bent in hingelike fashion, the bonding wires simultaneously defining the distance between the first and second substrates and mechanically fixing the second substrate above the first substrate in a plastic housing.

Such a power module has the advantage that a correspondingly thermally stable and thermally conductive substrate can be provided for the power semiconductor chips, while a much less expensive substrate that does not experience high thermal loading can be used for the signal semiconductor chips. Furthermore, the bonding wires bent in hingelike fashion obviate a complex supporting mechanism in order to define the distance between the two substrates; rather, the second substrate can be held at a defined distance from the first substrate with the aid of the bonding wires bent in hingelike fashion, the two placement sides being situated opposite one another. The bonding wires bent in hingelike fashion additionally form a mechanical fixing of the position of the second substrate above the first substrate and the two substrates including their semiconductor chips can be embedded in a plastics composition in this state defined by means of bonding wires bent in hingelike fashion.

The substrate populated with power semiconductor chips may have a ceramic board which, on the one hand, enables good heat dissipation and, on the other hand, has high temperature or thermal stability. This ensures that the power semiconductor chips can dissipate their entire heat loss via the ceramic board. In order to improve the dissipation of heat, the ceramic board may be mounted on a heat sink comprising a copper board. In order to realize as many functions as possible with such a ceramic board, the substrate populated with power semiconductor chips may have a multilayer ceramic board. In such a multilayer ceramic board, insulating layers alternate with metallic structures, the metallic structures of the individual metal layers being interconnected via contacts through the insulation layers.

A second substrate is provided for the signal semiconductor chips that generate little power loss, said second substrate having a printed circuit board made of glass-fiber-reinforced plastic. This glass-fiber-reinforced plastic may be coordinated with the expansion behavior of the semiconductor chip. In particular by virtue of the orientation of the glass fibers in the x and y directions, the substrate populated with signal semiconductor chips may have a coefficient of thermal expansion which approximately corresponds to the coefficient of thermal expansion of a semiconductor chip such as silicon. In the z direction, however, the coefficient of thermal expansion of the second substrate for the signal semiconductor chips may have a value that is customary for plastic, since in the z direction, no thermal expansion restrictions have to be imposed on the substrate for the signal semiconductor chips.

In the event of the second substrate being densely populated with signal semiconductor chips, it may be advantageous for a multilayer printed circuit board made of glass-fiber-reinforced plastic to be used as the second substrate. Such a second substrate made of a glass-fiber-reinforced printed circuit board may contain logic semiconductor components, signal semiconductor chips, integrated control circuits, integrated driver circuits or else temperature sensors and extend the possibilities for using the power module.

The second substrate populated with signal semiconductor chips may furthermore have passive components, such as resistors, capacitors or inductances, which can be realized both using thin-film technology and using thick-film technology on the printed circuit board of the second substrate.

In contrast to the second substrate comprising a printed circuit board with signal semiconductor chips that develop only little heat loss, there are arranged on the first substrate power semiconductor chips, such as insulated gate bipolar power transistors, which have a high power loss and emit this power loss to the surroundings via a ceramic board as substrate having correspondingly good thermal conductivity. Instead of bipolar power transistors, the first substrate may also have power semiconductor chips as metal oxide power field effect transistors. These transistors, abbreviated to MOS power transistors, likewise develop a high heat loss, so that a ceramic board as first substrate appears to be suitable for these power semiconductor chips. A further advantage of ceramic boards for such power semiconductor chips is that ceramic boards, with their coefficient of thermal expansion, can be adapted relatively precisely to the coefficient of thermal expansion of the semiconductor material. Consequently, despite considerable heat loss being developed, considerable thermal stresses do not arise between the power semiconductor chips and the first substrate.

In order to create intelligent power modules, the signal semiconductor chips on the second semiconductor board are intended to interact electrically with the power semiconductor chips on the first substrate. This is achieved by means of conductor tracks on the second substrate with signal semiconductor chips and the bonding wires bent in hingelike fashion, which are connected to corresponding conductor tracks on the first substrate.

The bonding wires bent in hingelike fashion may comprise aluminum and/or an aluminum alloy and have a minimum thickness of 100 micrometers in order to keep the mechanical strength or the defined distance between the first substrate and the second substrate. On account of the processability of aluminum bonding wires, the upper limit for the diameter of the aluminum bonding wires is approximately 300 micrometers.

A method for producing a power module having a first substrate populated with power semiconductor chips, and having a second substrate populated with signal semiconductor chips, has the following method steps:

Firstly, provision is made of a first substrate populated with power semiconductor chips, and of a second substrate populated with signal semiconductor chips. These two substrates are oriented with respect to one another such that their placement sides are arranged adjacent next to one another and edge regions of the placement sides of the two substrates that have bonding areas lie next to one another. For this purpose, the bonding areas on the edge regions are arranged in a row next to one another. After orientation, the substrates are connected at the edge region having bonding areas to bonding wires arranged next to one another in hingelike fashion.

After the production of all the bonding connections in the edge regions of the first and second substrates, the second substrate is folded over through 180° with bending of the bonding wires arranged in hingelike fashion, so that the substrates are oriented parallel one above the other and their placement sides are arranged facing one another. Finally, the substrates arranged in this way are packaged to form power modules in a plastic housing.

This method has the advantage that producing the bonding connections between two bonding area rows arranged in rows in the edge regions of the two substrates has afforded a simple solution which on the one hand can be realized inexpensively, and on the other hand does not take up expensive substrate area for power semiconductors and finally is fully automatable. Folding over the second substrate above the first substrate by bending the bonding connections arranged in hingelike fashion between the two substrates can also be carried out in an automated manner with the assistance of a vacuum tool. Finally, the substrates with the power semiconductor chips and the signal semiconductor chips can be packaged in a plastic housing.

In order to provide a first substrate with power semiconductor chips, firstly a ceramic board is coated with a conductor track structure. A row of bonding areas arranged next to one another with a predetermined grid dimension is provided in an edge region of said conductor track structure. Afterward, the power semiconductor chips are arranged on the first substrate and connected among one another and also to the conductor track structure via bonding wires with the bonding area row being left free. Finally, on the ceramic board, inner flat conductor ends may be arranged at conductor tracks of the conductor track structure that are provided for them, said flat conductor ends belonging to external flat conductors which, on the one hand, can be connected to supply voltages and, on the other hand, are provided for the application and tapping off of signals.

In order to provide a second substrate with signal semiconductor chips, a printed circuit board is provided with a conductor track structure having, in an edge region, a row of bonding areas arranged next to one another, the number and grid dimension of which correspond to the bonding area row of the first substrate. The signal semiconductor chips may then be arranged on the conductor track structure and be connected via bonding wires with the bonding area row being left free. Since the substrate for the signal semiconductor chips is a printed circuit board, as many signal semiconductor chips as desired can be accommodated relatively inexpensively on the printed circuit board. Said signal semiconductor chips may have logic circuits, sensor circuits, passive components, driver circuits and other control circuits.

Temperature sensors are preferably used as sensor circuits in order for example to thermally monitor the power module. Before the two substrates are connected via bonding wires arranged correspondingly in hingelike fashion, the two substrates are oriented with respect to one another in such a way that the bonding area rows of the substrates are arranged next to one another. Consequently, a simple and inexpensive bonding connection technique enables an electrical and mechanical connection of the two substrates oriented with respect to one another on the bonding areas adapted to one another.

The connection may be effected by means of thermocompression sonic bonding of aluminum and/or aluminum alloy bonding wires, said bonding wires having a diameter of at least 100 micrometers in order to ensure the mechanical stability. On account of the customary bonding tools, this diameter is upwardly limited and should not exceed 300 micrometers.

By means of a vacuum tool, the second substrate can then be folded over automatically through 180° with bending of the bonding wires arranged in hingelike fashion, so that the substrates are oriented parallel one above the other and their placement sides are arranged facing one another. This simultaneously creates a very compact arrangement comprising two substrates populated with semiconductor chips for a power module. This compact arrangement of the two substrates may subsequently be implemented in a plastic housing by means of injection molding technology with the substrates arranged one above the other being embedded in a plastic housing composition.

A further possibility for packaging the power module consists in arranging the two substrates folded on top of one another in a prefabricated plastic housing and then filling the cavities between the substrates and the prefabricated plastic housing with silicone composition. Before a plastic housing is arranged over the two substrates, the first substrate, on which the power semiconductor chips are arranged, may be mounted on a metal board that preferably comprises copper or a copper alloy. Said metal board forms, on the one hand, an outer wall for the plastic housing and, on the other hand, an effective heat sink for the heat loss.

After the power module has been packaged in a plastic housing, external flat conductors project from the plastic housing, which are electrically connected to the power semiconductor chips, on the one hand, and via the bonding wires bent in hinge-type fashion to the signal semiconductor chips, on the other hand. The cross sections of said external flat conductors may be adapted to the power consumption for the power semiconductor chips and have a larger cross section than external flat conductors provided for the power semiconductor chips.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a ceramic substrate with power semiconductor chips and a series of external flat conductors for power transmission and a further series of external flat conductors for signal transmission.

FIG. 3 illustrates a schematic diagram with a first substrate, on which power semiconductor chips are arranged, and a second substrate having signal semiconductor chips, the substrates being connected to one another via hingelike bonding wires.

FIG. 4 illustrates a diagrammatic cross section through a power module before and after the folding over of the second substrate.

FIG. 5 illustrates a perspective schematic diagram of a power module with the second substrate folded over.

FIG. 6 illustrates a perspective schematic diagram of a power module of a further embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
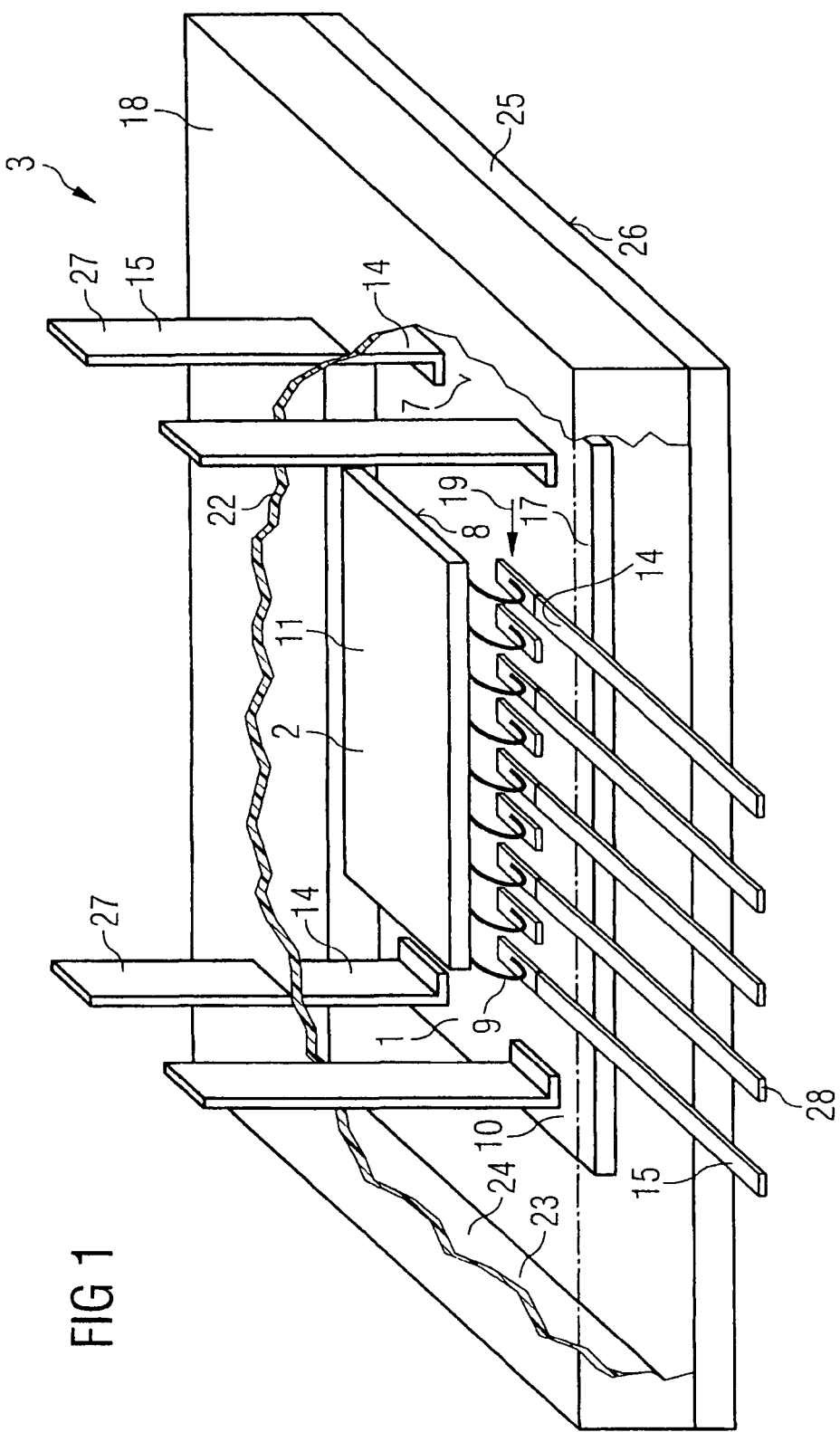
FIG. 1 illustrates a diagrammatic, partly broken-open, perspective view of a first embodiment of the invention.

FIG. 1 illustrates a diagrammatic, partly broken-open, perspective view of a power module 3 of a first embodiment of the invention. The reference symbol 1 identifies a ceramic board which, as substrate 1, has power semiconductor chips (not shown). The reference symbol 2 identifies a second substrate, which has a printed circuit board 11 made of glass-fiber-reinforced plastic and is folded above the first substrate 1 by means of bonding wires 9 bent in hingelike fashion. The reference symbol 7 identifies the placement side of the first substrate and the reference symbol 8 identifies the placement side of the second substrate.

The two placement sides 7 and 8 face one another since the two substrates are arranged in a manner folded one above the other in the plastic housing 18. In this embodiment of the invention, four external flat conductors 27 are arranged for the power supply of the power semiconductor chips on the first substrate 1 with their inner flat conductor ends and project vertically from the plastic housing 18. Five external flat conductors 28 for signal transmissions project horizontally from the plastic housing and are fixed with their inner flat conductor ends on the ceramic substrate and are electrically connected via the bonding wires 9 to the signal semiconductors on the second substrate 2.

The bonding wires 9 bent in hingelike fashion are arranged in a predetermined grid dimension on a bonding area row 19 in the edge region 17 of the ceramic board 10 of the first substrate 1. The ceramic board 10 is mounted on a metal board 25, which, in this embodiment of the invention, serves as a heat sink and forms an outer wall 26 of the plastic housing 18. The plastic housing 18 comprises a prefabricated plastic housing part 22 placed onto the metal board 25, and the cavity 23 between the preformed plastic housing 22 and the substrates 1 and 2 is potted with a silicone composition after the placement onto the metal board.

This construction makes it possible to realize inexpensively and compactly a power module which has its sensors, logic circuits, control circuits and/or driver circuits arranged on the second substrate 2 and has the power semiconductor chips in the form of MOS power transistors or insulated gate bipolar power transistors or power diodes on the intensively cooled first substrate 1.

FIGS. 2 to 6 illustrate schematic diagrams of results and intermediate products of a method for producing a power module in accordance with a further embodiment of the invention. Components of FIGS. 2 to 6 having functions identical to those in FIG. 1 are identified by identical reference symbols and are not discussed separately.

Figure 2:
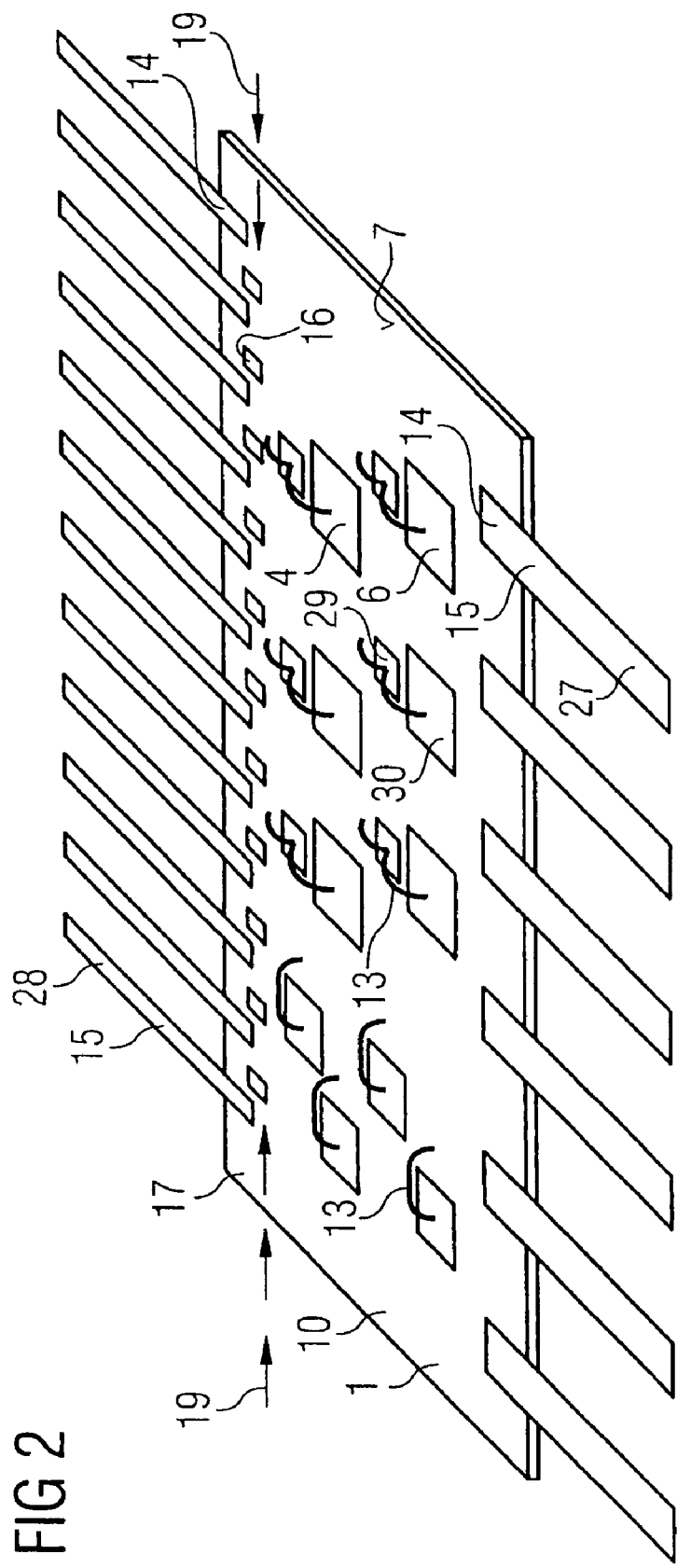
FIGS. 2 to 6 illustrate schematic diagrams of results and intermediate products of a method for producing a power module in accordance with further embodiments of the invention.

FIG. 2 illustrates a ceramic substrate 1 with power semiconductor chips 4 and a series of external flat conductors 27 for power transmission and a further series with external contacts 28 for signal transmissions. In this case, the external flat conductors 28 for signal transmissions have a smaller cross section than the external flat conductors 27 for power transmission. Arranged on the ceramic board 10 are power diodes 29 and power transistors 30, which are connected via bonding connections 13 among one another and to a conductor track structure (not shown).

A row 19 arranged in the edge region 17 of the ceramic substrate 10 has bonding areas 16 that are kept free of bonding connections 13. However, said bonding areas 16 are electrically connected to the conductor track structure (not shown). Moreover, said bonding areas are in part electrically connected to the external flat conductors 28 for signal transmissions via the conductor track structure on the ceramic substrate 10.

Figure 3:
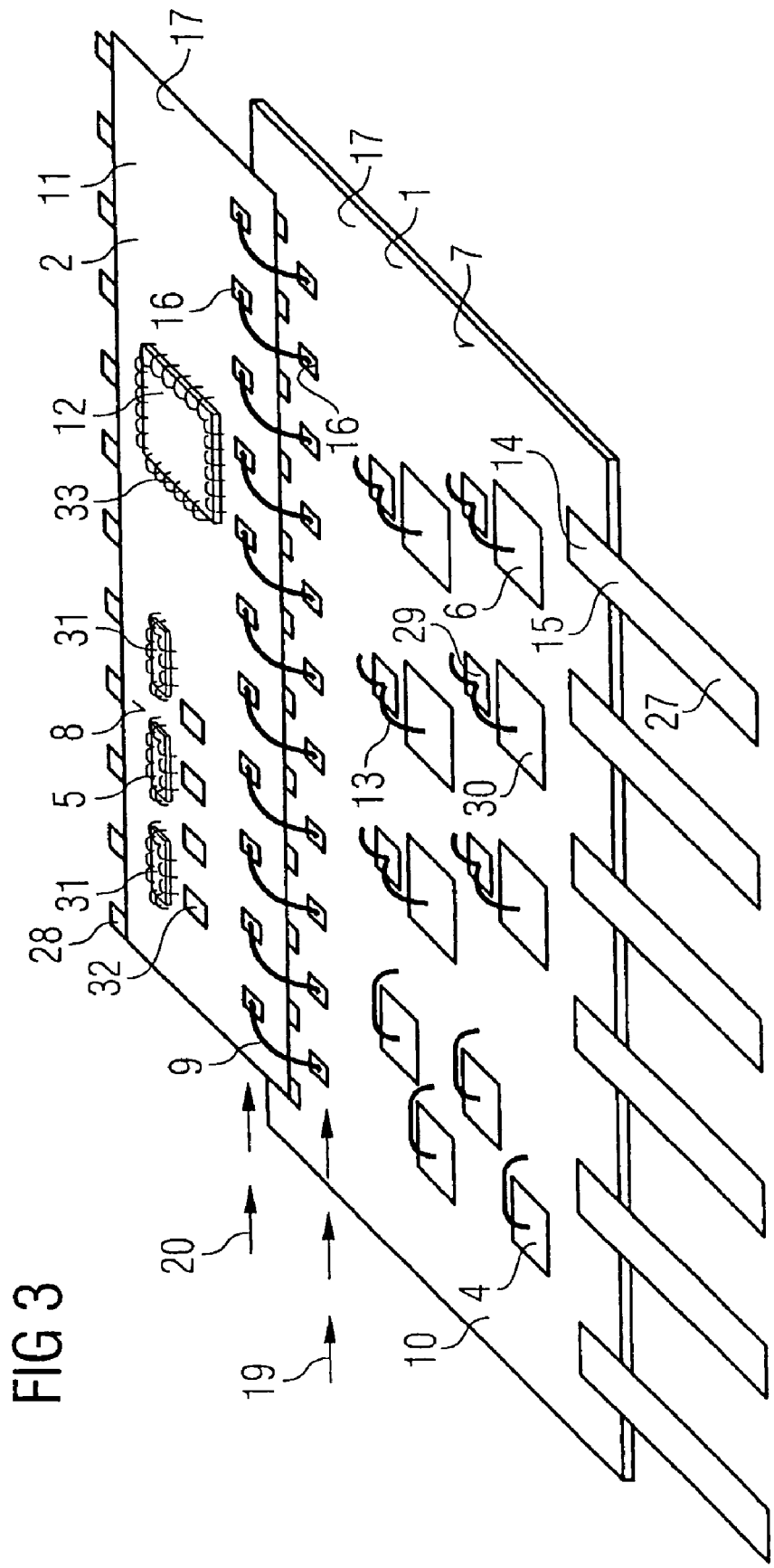

FIG. 3 illustrates a schematic diagram with a first substrate 1, on which power semiconductor chips 4 are arranged, and with a second substrate 2 having signal semiconductor chips, the substrates 1 and 2 being mechanically and electrically connected to one another via hingelike bonding wires 9. The second substrate 2 made of a glass-fiber-reinforced printed circuit board 11 may have logic chips 12, control or driver chips 31 and/or temperature sensor chips 32 in order to create an intelligent power module. Said second substrate 2 has a conductor track structure that is not shown in detail and is electrically connected to the signal semiconductor chips 5 via bonding wires 33. In this case, a row 20 of bonding areas 16 is kept free of internal bonding wires 13 of the substrate 2.

The bonding area row 20 in the edge region 17 of the substrate 2 is oriented in such a way that it is arranged parallel to the bonding area row 19 of the substrate 1. By means of an inexpensive bonding method, hingelike bonding wires 9 made of aluminum having a minimum diameter of 100 micrometers can thus connect the bonding areas 16 of the bonding row 20 to the bonding areas 16 of the bonding row 19, so that the ceramic substrate 10 is connected to the printed circuit board 11 in hingelike fashion. The bonding wires 9 not only form a mechanical hinge but at the same time serve for electrical connection between the conductor track structure of the ceramic substrate 10 and the conductor track structure of the printed circuit board 11.

Figure 4:
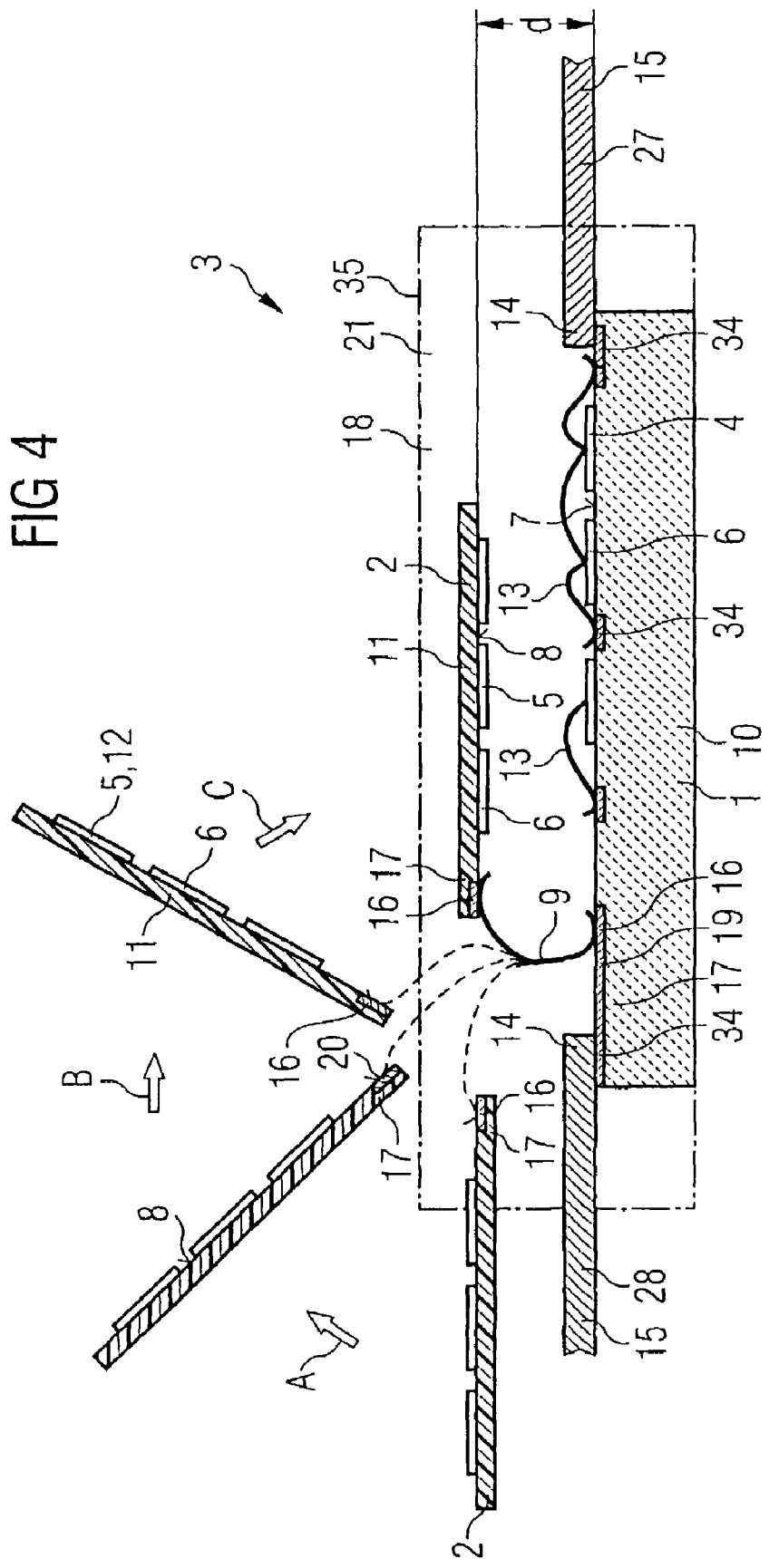

FIG. 4 illustrates a perspective schematic diagram of a power module 3 with a second substrate 2 folded over. The process of folding over the second substrate 2 above the first substrate 1 is illustrated in four positions, the arrows a, b and c illustrating the folding-over movement for the second substrate 2. During this folding-over process, the bonding wires 9 flex in hingelike fashion and, on account of their stiffness after flexure, they define the distance d between the first substrate 1 and the second substrate 2. Before the folding-over process, the bonding areas 16 in the edge regions 17 of the two substrates 1 and 2 are arranged in such a way that the bonding wire 9 can be securely fixed on the bonding areas 16 by means of a bonding tool.

The folding-over process can be carried out automatically with the aid of a vacuum tool. The external flat conductors 28 for signal transmission are electrically connected to the signal semiconductor chips 6 of the second substrate 2 via the conductor track structure 34, the bonding areas 16 and the bonding wires 9 bent in hingelike fashion. The external flat conductors 27, which are likewise fixed on the ceramic substrate 10 by their inner flat conductor ends 14, are electrically connected to the power semiconductor chips 4 via the conductor track structure 34 and the bonding connections 13. The broken line 35 in FIG. 4 illustrates the contours of a plastic housing composition 21 that can be applied after the second substrate 2 has been folded over.

Figure 5:
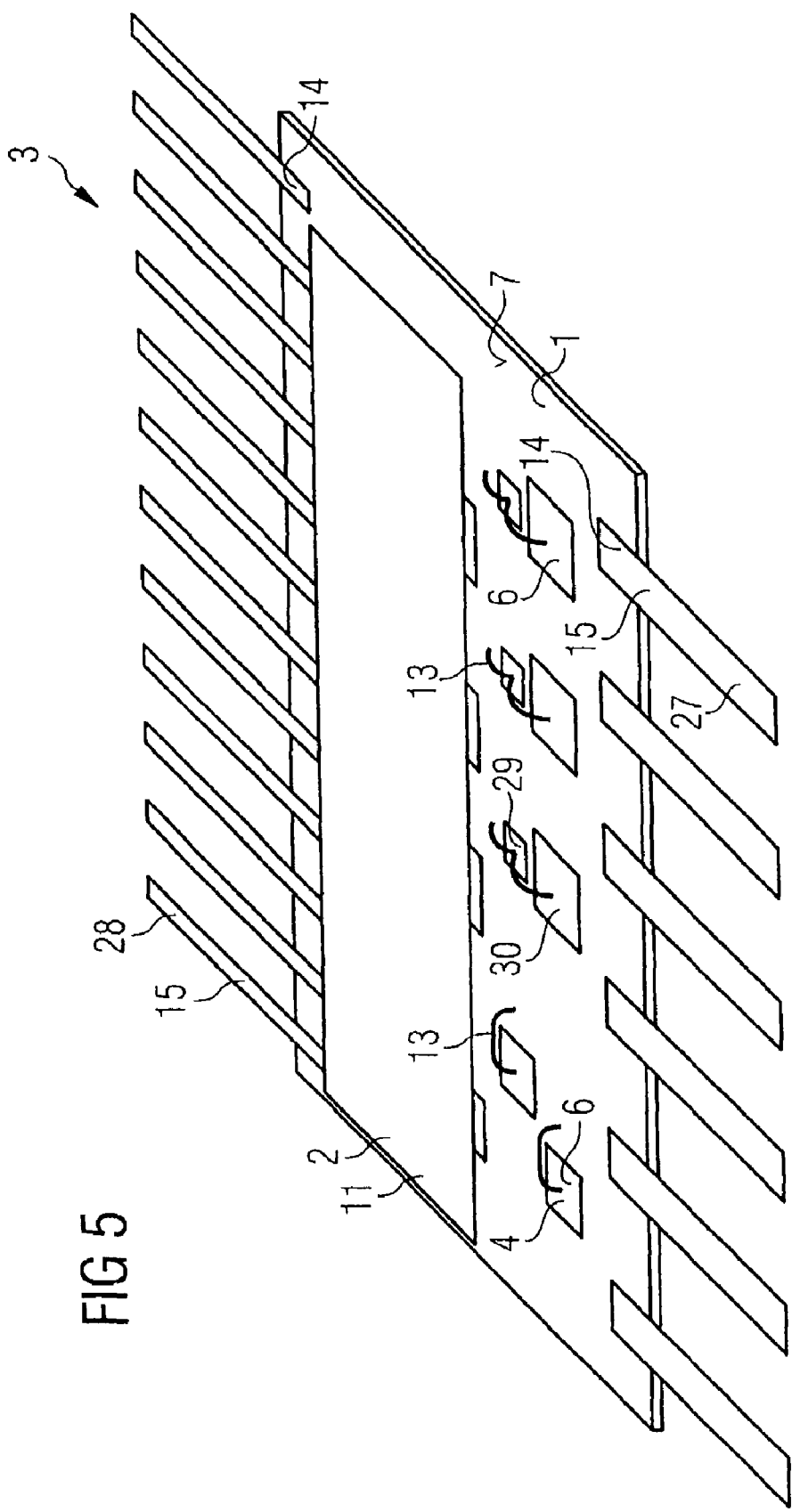

FIG. 5 illustrates a perspective schematic diagram of a power module 3 with a second substrate 2 folded over. The plastic housing composition has been omitted in the form of illustration of FIG. 5 in order to demonstrate the relatively flat arrangement of the two substrates 1 and 2 one above the other. Consequently, the method according to the invention can be used to produce a compact power module which manages without complicated supporting structures and connecting structures between the two substrates 1 and 2 and nevertheless forms a power module 3 equipped with intelligent control and logic technology.

Figure 6:
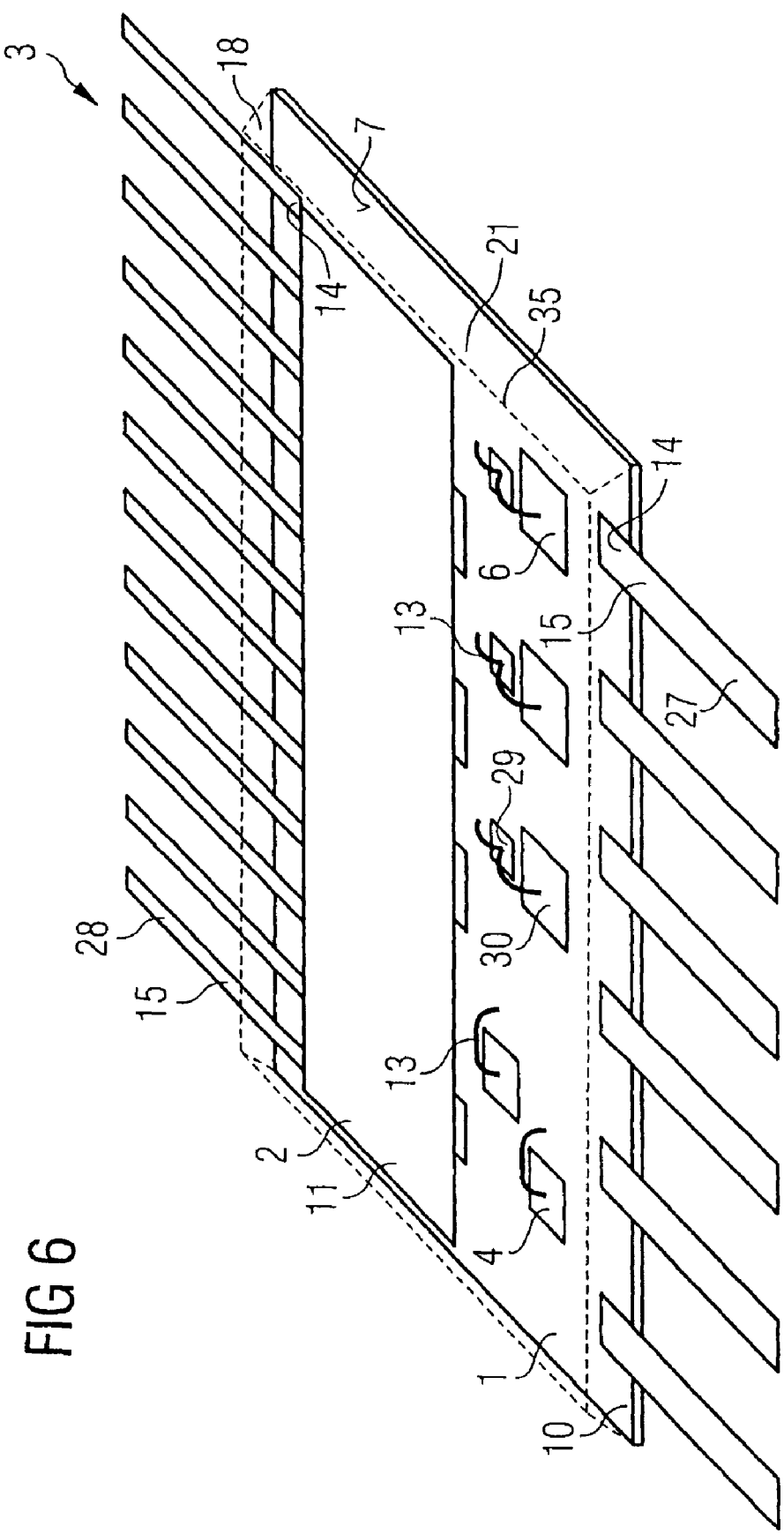

FIG. 6 illustrates a perspective schematic diagram of a power module 3 of a further embodiment of the invention, the broken lines 35 showing the contours of the plastic housing 18. This embodiment of the invention according to FIG. 6 differs from the embodiment according to FIG. 1 by virtue of the fact that both the external flat conductors 27 for power transmission and the external flat conductors 28 for signal transmission project horizontally from the plastic housing 18.

What is claimed:

1. A power module comprising:
   a first substrate populated with power semiconductor chips having a first placement side;
   a second substrate populated with signal semiconductor chips having a second placement side, the first and second substrates in the power module being oriented parallel one above the other and the first and second placement sides being arranged facing one another; and
   one or more bonding wires configured in a hingelike manner electrically connecting the first and second placement sides to one another and defining the distance between the first and second substrates.

2. The power module of claim 1, comprising wherein the signal semiconductor chips are connected via conductor tracks on the second substrate and the bonding wires to the power semiconductor chips on the first substrate via external conductors.

3. The power module of claim 1, comprising wherein the power semiconductor chips on the first substrate are connected via bonding wires directly on the first substrate among one another and to inner flat conductor ends of external flat conductors.

4. The power module of claim 1, comprising wherein the bonding wires comprise aluminum.

5. The power module of claim 1, comprising wherein the bonding wires have a diameter of between 100 and 300 micrometers.

6. A power module comprising:
   a first substrate populated with power semiconductor chips having a first placement side;
   a second substrate populated with signal semiconductor chips having a second placement side, the first and second substrates in the power module being oriented parallel one above the other and the first and second placement sides being arranged facing one another; and
   bonding wires bent in a hingelike manner electrically connecting the first and second placement sides to one another and defining the distance between the first and second substrates and mechanically fixing the first and second substrates in a plastic housing.

7. The power module of claim 6, comprising wherein the first substrate comprises a ceramic board.

8. The power module of claim 6, wherein the first substrate comprises a multilayer ceramic board.

9. The power module of claim 6, wherein the second substrate comprises a printed circuit board made of glass-fiber-reinforced plastic.

10. The power module of claim 6, wherein the second substrate comprises a multilayer printed circuit board comprising glass-fiber-reinforced plastic.

11. The power module of claim 6, comprising wherein the second substrate populated with signal semiconductor chips includes logic semiconductor components.

12. The power module of claim 6, comprising wherein the second substrate populated with signal semiconductor chips includes semiconductor chips with integrated control circuits.

13. The power module of claim 6, comprising wherein the second substrate populated with signal semiconductor chips includes semiconductor chips with integrated driver circuits.

14. The power module of claim 6, comprising wherein the second substrate populated with signal semiconductor chips includes semiconductor chips with temperature sensors.

15. The power module of claim 6, comprising wherein the second substrate populated with signal semiconductor chips includes semiconductor chips with passive components.

16. The power module of claim 6, comprising wherein the first substrate populated with power semiconductor chips includes semiconductor chips with insulated gate bipolar power transistors.

17. The power module of claim 6, comprising wherein the first substrate populated with power semiconductor chips includes semiconductor chips with metal oxide power field effect transistors.

18. A power module comprising:
   a first substrate populated with power semiconductor chips having a first placement side;
   a second substrate populated with signal semiconductor chips having a second placement side, the first and second substrates in the power module being oriented parallel one above the other and the first and second placement sides being arranged facing one another; and a plurality of bonding wires bent in a hingelike manner electrically connecting the first and second placement sides to one another and defining the distance between the first and second substrates and mechanically fixing the first and second substrates in a plastic housing, wherein the signal semiconductor chips are connected via conductor tracks on the second substrate and the bonding wires bent in hinge-type fashion to the power semiconductor chips on the first substrate electrically and/or to external flat conductors.

19. The power module of claim 18, comprising wherein the power semiconductor chips on the first substrate are connected via bonding wires and/or conductor tracks directly on the first substrate among one another and to inner flat conductor ends of external flat conductors.

20. The power module of claim 19, comprising wherein the bonding wires bent in hinge-type fashion comprise aluminum and/or an aluminum alloy.

21. The power module of claim 20, comprising wherein the bonding wires bent in hinge-type fashion have a diameter of between 100 and 300 micrometers.

22. A power module comprising:

a first substrate populated with power semiconductor chips having a first placement side;

a second substrate populated with signal semiconductor chips having a second placement side, the first and second substrates in the power module being oriented parallel one above the other and the first and second placement sides being arranged facing one another; and means for bonding configured in a hingelike manner electrically connecting the first and second placement sides to one another and defining the distance between the first and second substrates and mechanically fixing the first and second substrates in a plastic housing.

\* \* \* \* \*